(12) United States Patent
Ren et al.

(10) Patent No.: US 11,881,855 B2
(45) Date of Patent: Jan. 23, 2024

(54) SUPERCONDUCTING INTEGRATED CIRCUIT DESIGN METHOD BASED ON PLACEMENT AND ROUTING BY DIFFERENT-LAYER JTLS

(71) Applicant: SHANGHAI INSTITUTE OF MICROSYSTEM AND INFORMATION TECHNOLOGY CHINESE ACADEMY OF SCIENCES, Shanghai (CN)

(72) Inventors: Jie Ren, Shanghai (CN); Ruo Ting Yang, Shanghai (CN); Xiao Ping Gao, Shanghai (CN); Zhen Wang, Shanghai (CN)

(73) Assignee: SHANGHAI INSTITUTE OF MICROSYSTEM AND INFORMATION TECHNOLOGY CHINESE ACADEMY OF SCIENCES, Shanghai (CN)

( * ) Notice: Subject to any disclaimer, the term of this patent is extended or adjusted under 35 U.S.C. 154(b) by 189 days.

(21) Appl. No.: 17/634,551

(22) PCT Filed: Mar. 22, 2021

(86) PCT No.: PCT/CN2021/081971
§ 371 (c)(1),
(2) Date: Feb. 11, 2022

(87) PCT Pub. No.: WO2021/227659
PCT Pub. Date: Nov. 18, 2021

(65) Prior Publication Data
US 2022/0286137 A1    Sep. 8, 2022

(30) Foreign Application Priority Data
May 12, 2020   (CN) .......................... 202010396987.9

(51) Int. Cl.
*H03K 19/195*  (2006.01)
*H10N 60/12*   (2023.01)
(Continued)

(52) U.S. Cl.
CPC .......... *H03K 19/195* (2013.01); *G01J 1/0425* (2013.01); *G01J 1/44* (2013.01);
(Continued)

(58) Field of Classification Search
CPC ............... G06F 17/505; G06F 17/5072; G06F 17/5077; G06F 2217/087; G06F 1/10;
(Continued)

(56) References Cited

U.S. PATENT DOCUMENTS

2017/0104491 A1*   4/2017   Shauck ............ H03K 19/17708

FOREIGN PATENT DOCUMENTS

| CN | 102334206 | 1/2012 |
|----|-----------|--------|
| CN | 107704649 | 2/2018 |
| CN | 111682022 | 9/2020 |

OTHER PUBLICATIONS

"International Search Report (Form PCT/ISA/210)" of PCT/CN2021/081971, with English translation thereof, dated Jun. 25, 2021, pp. 1-4.

* cited by examiner

*Primary Examiner* — Arnold M Kinkead
(74) *Attorney, Agent, or Firm* — JCIPRNET

(57) ABSTRACT

A superconducting integrated circuit design method based on placement and routing by different-layer JTLs comprises: cutting a bias line at a cell data interface of a cell library, and reserving a position of a via; placing and arranging cells on a logic cell layer according to a schematic circuit logic diagram; connecting clock lines of each of the cells by using a JTL and a splitter of the logic cell layer; and performing
(Continued)

data connection on each of the cells by using JTLs of a transverse JTL routing layer and a longitudinal JTL routing layer which are not in the same layer as the logic cell layer, wherein the JTL of the transverse JTL routing layer is used as a transverse routing cell for data between the cells, the JTL of the longitudinal JTL routing layer is used as a longitudinal routing cell for data between the cells.

7 Claims, 4 Drawing Sheets

(51) Int. Cl.
*H10N 60/80* (2023.01)
*H10N 69/00* (2023.01)
*G01J 1/44* (2006.01)
*G01J 1/04* (2006.01)
*G06F 1/10* (2006.01)
*H01L 27/02* (2006.01)

(52) U.S. Cl.
CPC ............ *G06F 1/10* (2013.01); *H01L 27/0207* (2013.01); *H10N 60/12* (2023.02); *H10N 60/805* (2023.02); *H10N 69/00* (2023.02)

(58) Field of Classification Search
CPC ........... G11C 11/44; G01J 1/44; G01J 1/0425; H03K 19/195; H10N 60/12; H10N 60/805; H10N 69/00; H01L 27/0207; H01L 39/10
USPC ................ 716/126, 127, 130, 100; 505/832; 365/162; 257/31; 326/3, 41
See application file for complete search history.

SUPERCONDUCTING INTEGRATED CIRCUIT DESIGN METHOD BASED ON PLACEMENT AND ROUTING BY DIFFERENT-LAYER JTLS

CROSS-REFERENCE TO RELATED APPLICATION

This application is a 371 of international application of PCT application serial no. PCT/CN2021/081971, filed on Mar. 22, 2021, which claims the priority benefit of China application no. 202010396987.9, filed on May 12, 2020. The entirety of each of the above mentioned patent applications is hereby incorporated by reference herein and made a part of this specification.

TECHNICAL FIELD

The present disclosure relates to the technical field of superconducting integrated circuits, in particular to a superconducting integrated circuit design method based on placement and routing by different-layer Josephson transmission lines (JTLs).

BACKGROUND

Superconducting integrated circuits refer to integrated circuits based on Josephson junctions and superconducting materials and including applications such as single-flux-quantum (SFQ) circuits.

The SFQ circuit, which is a special superconducting integrated circuit, is mainly composed of Josephson junctions, in which digital logics "1" and "0" are represented by presence or absence of a flux quantum $\Phi_0$. Compared with a traditional complementary metal oxide semiconductor (CMOS) circuit, the miniaturization and quantification properties of the flux quantum significantly reduce the influence of crosstalk and power consumption, and the flux quantum is endowed with extremely high frequency due to narrow voltage pulses generated in the junctions when entering and exiting from a loop. With the advantages of the ultra-high working speed and extremely low power consumption, the SFQ circuit has a remarkable prospect in applications such as ultra-wideband analog-to-digital converters (ADCs)/digital-to-analog converters (DACs) and superconducting computers.

Since signals in the SFQ circuit are transmitted with extremely short voltage pulses, cells of the SFQ circuit are connected through two structures: a Josephson transmission line (JTL) and a passive transmission line (PTL), which is different from the traditional CMOS circuit whose cells are connected merely through wires. Schematic circuit diagrams of these two transmission lines are as shown in FIG. 1 and FIG. 2 respectively. The PTL is formed by connecting a front-end driver to a rear-end receiver through a micro-strip line (MSL), the driver and the receiver are added to front and back cells respectively, and the micro-strip line can be regarded as a CMOS signal line. The JTL is a cell composed of Josephson junctions connected through inductors and is widely used in circuits since signal transmission integrity is ensured by the junctions triggered in sequence when the signal is transmitted through the cell. The PTL is often used in long-distance transmission and large-scale circuit design on account of its transmission speed close to the speed of light and the convenience similar to that of the CMOS line. However, each cell interface connected to the PTL requires a driver and a receiver additionally, resulting in excessive area occupation of circuits; and the micro-strip line is affected at high frequency and is difficult in impedance matching, resulting in limitation on the circuit area, speed and yield when being used. Compared with the PTL, the JTL has the advantages of simple structure and desirable working yield. If its shortcoming of being inconducive to cross connection is overcome, placement and routing during existing design is simplified and the circuit area is reduced on the basis of guaranteeing the circuit speed and yield.

SUMMARY

The present disclosure provides a superconducting integrated circuit design method based on placement and routing by different-layer JTLs, which overcomes the shortcoming that the JTL is inconducive to routing, maintains the advantage of a high speed of a circuit and improves a yield of the circuit.

A technical solution used by the present disclosure to solve the technical problems is to provide a superconducting integrated circuit design method based on placement and routing by different-layer JTLs. The method includes the following steps:

(1) cutting a bias line at a cell data interface of a cell library, and reserving a position of a via;
(2) placing and arranging cells on a logic cell layer according to a schematic circuit logic diagram;
(3) connecting clock lines of each of the cells by using a JTL and a splitter of the logic cell layer; and
(4) performing data connection on each of the cells by using JTLs of a transverse JTL routing layer and a longitudinal JTL routing layer which are not at the same layer as the logic cell layer, wherein the JTL of the transverse JTL routing layer is used as a transverse routing cell for data between the cells, the JTL of the longitudinal JTL routing layer is used as a longitudinal routing cell for data between the cells, and a JTL on an upper layer is connected to the cell data interface at a lower layer by using the via.

A width of the via reserved in the step (1) is less than or equal to a width of the bias line.

In the step (2), placing and arranging the cells on the logic cell layer follows an on grid principle.

The logic cell layer includes a ground layer, a top wire layer and a bottom electrode wire layer arranged from top to bottom, wherein the bottom electrode wire layer is connected to a resistor, the top wire layer is connected to a standard Josephson triple-layer film junction, the bottom electrode wire layer acts as signal wiring, and the top wire layer acts as bias wiring.

The transverse JTL routing layer and the longitudinal JTL routing layer in the step (4) have a different-layer structure.

The transverse JTL routing layer includes a ground layer, a top wire layer and a bottom electrode wire layer arranged from top to bottom, wherein the top wire layer is connected to a self-shunted Josephson junction, the bottom electrode wire layer acts as signal wiring, and the top wire layer acts as bias wiring.

The longitudinal JTL routing layer includes a ground layer, a top wire layer and a bottom electrode wire layer arranged from top to bottom, wherein the top wire layer is connected to a self-shunted Josephson junction, the bottom electrode wire layer acts as signal wiring, and the top wire layer acts as bias wiring.

Beneficial Effects

Compared with the prior art, the method uses the above technical solution and thus has the following advantages and positive effects: a multi-layer junction technology is utilized, the JTL used for signal transmission is designed by using the junctions on the upper layer, and a logic circuit portion is designed by using the junctions on the lower layer, thereby overcoming the shortcoming that the JTL is inconducive to routing, maintaining the advantage of the high speed of the circuit, improving the yield of the circuit, and laying a foundation for possible automatic placement and routing in the future.

DETAILED DESCRIPTION OF THE EMBODIMENTS

The present disclosure will be further described below with reference to specific embodiments. It should be understood that these embodiments are merely used for describing the present disclosure rather than limiting the scope of the present disclosure. In addition, it should be understood that after reading the contents shown in the present disclosure, those skilled in the art may make various changes or modifications to the present disclosure, and these equivalent forms also fall within the scope defined by the appended claims of the present application.

An embodiment of the present disclosure relates to a superconducting integrated circuit design method based on placement and routing by different-layer JTLs. A main objective of the method is to design an implementation method for placement and routing of a circuit by different-layer JTLs based on the intention that an area of a circuit is not excessively expanded and an operation speed and a yield of the circuit are maintained. The method includes technology implementation, JTL routing distribution design and various-layer interface manner design, so as to overcome the shortcomings of low degree of freedom and difficult cross routing of original JTL routing. The method is specifically described as follows.

Figure 1:
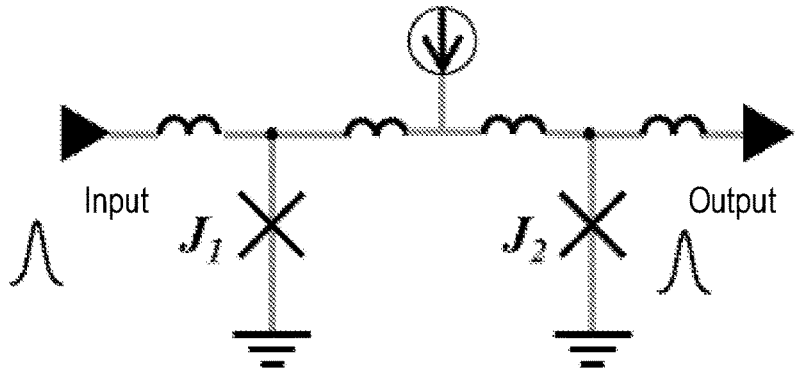
FIG. 1 is a schematic circuit diagram of a JTL in the prior art.
Figure 2:
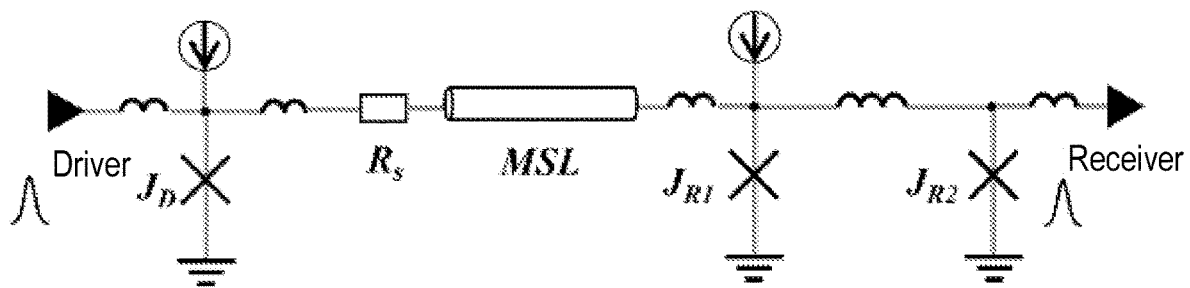
FIG. 2 is a schematic circuit diagram of a PTL in the prior art.
Figure 3:
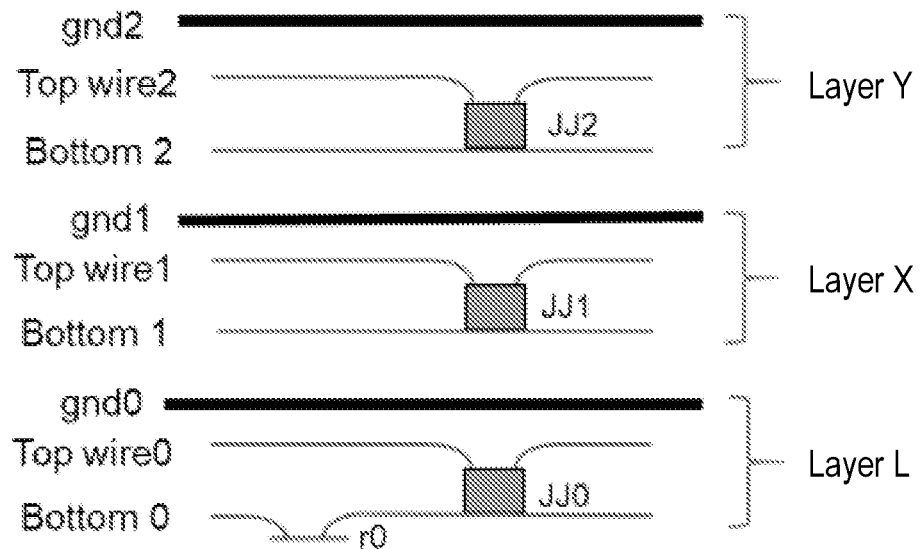
FIG. 3 is a section view of a multi-layer junction technology in the present disclosure.

In order to use different-layer JTLs for routing, first of all, JTL layers for routing need to be separated from an existing logic circuit layer. Multilayer junctions, with a technological section as shown in FIG. 3, are added besides an original technology, and only a key metal layer and a Josephson junction region are shown in the figure. In FIG. 3, a layer X, a layer Y and a layer L are a transverse JTL routing layer, a longitudinal JTL routing layer and a logic cell layer respectively. Gnd in each layer represents a ground layer, Top wire represents a top wire layer, Bottom represents a bottom electrode wire layer, JJ represents a Josephson junction, and r represents a resistor. In the embodiment, the bottom electrode wire layer acts as signal wiring, and the top wire layer acts as bias wiring. The Josephson junction used in the logic cell layer is a standard Josephson triple-layer film junction JJ0, and Josephson junctions used in the transverse JTL routing layer and the longitudinal JTL routing layer are self-shunted Josephson junctions JJ1 and JJ2. Electrical properties of the Josephson junctions may be understood as that no hysteresis phenomenon exists after the resistor is connected in parallel on the basis of the standard triple-layer film junction, so that the Josephson junctions may be used directly. The junction region on each layer may be independently used in cell circuit design, such that JTLs designed by the junctions on the upper layer may not interfere with JTLs on the lower layer or logic cells in overall circuit design, thus achieving a function of convenient cross routing.

It is worth mentioning that in the embodiment, the logic cell layer may also be arranged at a topmost layer or a middle layer, and the technical effects of the present disclosure may be achieved as long as the logic cell layer is not at the same layer as the transverse JTL routing layer and the longitudinal JTL routing layer. Similarly, the transverse JTL routing layer and the longitudinal JTL routing layer may also be arranged in any layer as long as the transverse JTL routing layer and the longitudinal JTL routing layer form a triple-layer structure with the logic cell layer.

Figure 4:
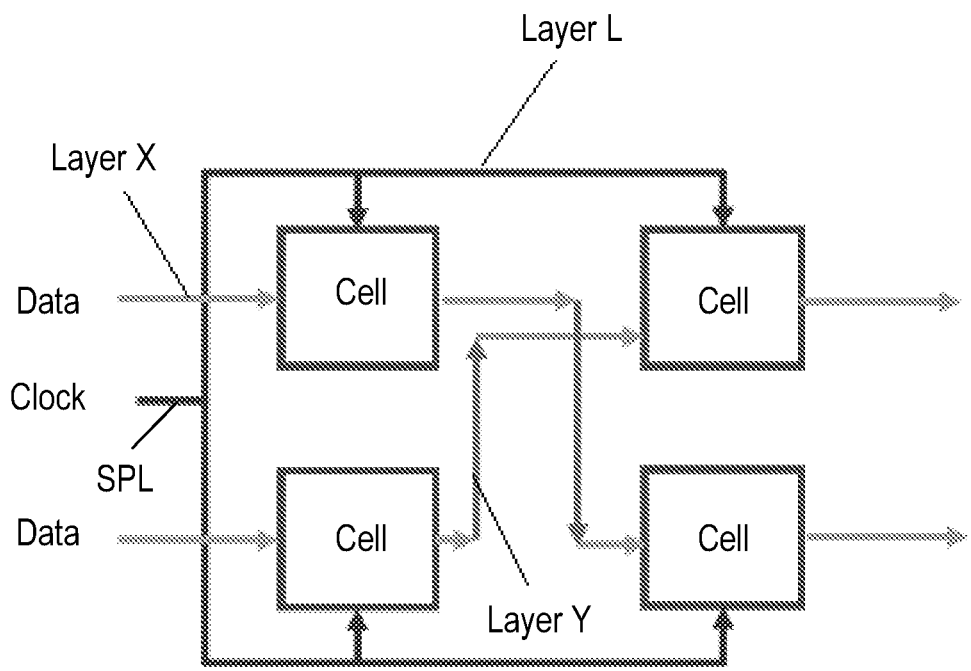
FIG. 4 is a schematic diagram of routing selection of data lines and clock lines between cells in the present disclosure.

After the technology is determined, it is necessary to allocate functions for the JTL of each layer. In the embodiment, JTLs are designed on the layer X and the layer Y respectively, the JTL on the layer X is used as a transverse routing cell for data between the cells, the JTL on layer Y is used as a longitudinal routing cell for data between the cells, the original logic cell on the layer L is unchanged, and a JTL and a splitter (SPL) on the layer L may be used as a routing cell for a clock, such that routing is performed for the clock and the data separately, the problem of data crossing is solved, and specific routing is as shown in FIG. 4.

After the routing method is determined, interfaces for interaction of the JTLs on the upper layer and the lower layer are designed. There are three routing layers (the layers X\Y\L) totally, so that there are three vias for interaction: Via(B2_B1), Via(B1_B0) and Via(B2_B0). Since the interface overlaps the bias wiring, it is necessary to cut at a bias portion of the circuit where there is a via to avoid overlap between the via and the bias portion, as shown in FIG. 5.

Figure 5:
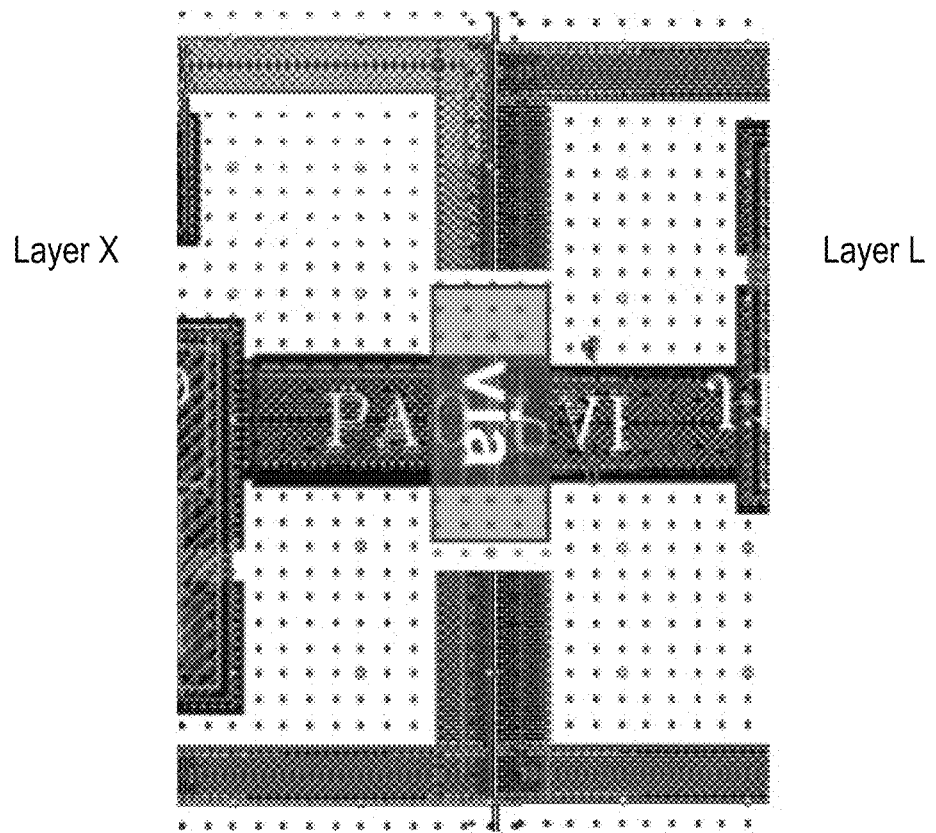
FIG. 5 is a schematic diagram showing design of a two-layer circuit connection interface in the present disclosure.
Figure 6:
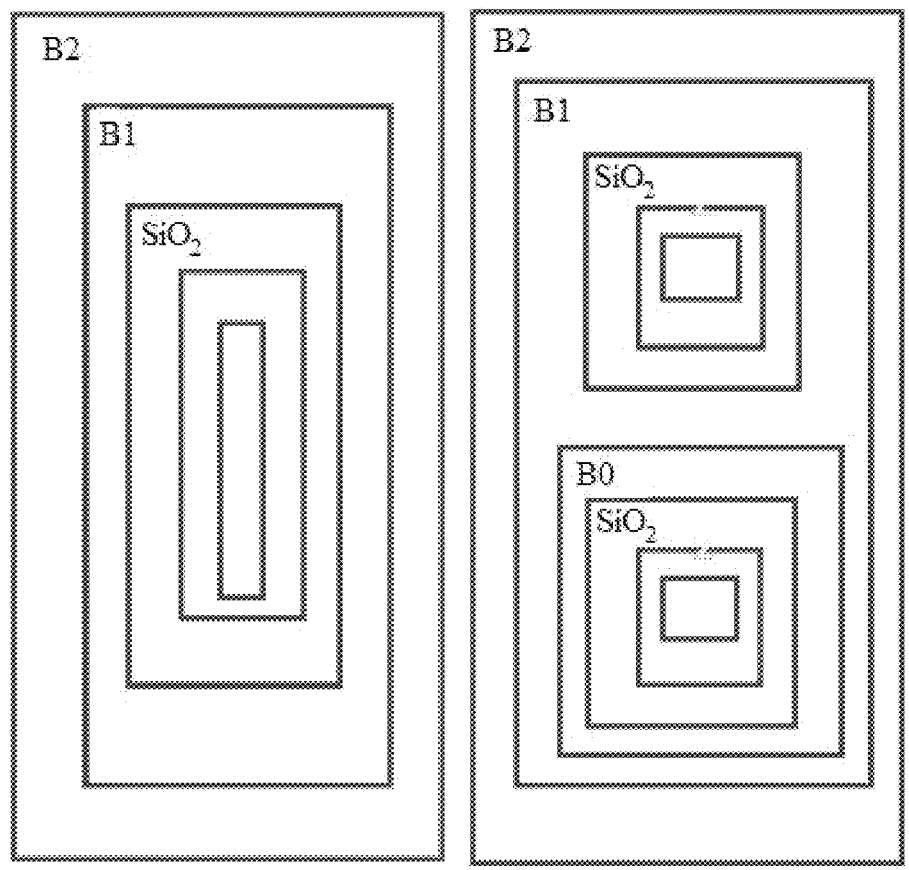
FIG. 6 is a schematic diagram showing design of a via between layers in the present disclosure.

After the interface is determined, it is guaranteed that an upper via is designed within a width of a bias line, as shown in a portion Via in FIG. 5. The vias of the two adjacent layers and the via spaced by one layer are as shown on a left side and a right side of FIG. 6 respectively. After what is described above is determined, it is possible to implement routing and circuit design by the JTLs on different layers more conveniently.

The design for implementing the superconducting circuit by the JTLs on different layers is similar to the design of a general superconducting circuit. Since the design mainly is aimed at compatibility with the original cell, no major changes to the previous cell are required except for the treatment of the interface. Therefore, the method specifically includes the following steps.

(1) Since cells may interact with the upper layer and the lower layer during data input and output, firstly, a bias line is cut at a cell data interface of a cell library, and a position of a via is reserved.

(2) Then, cells on the logic cell layer at a bottommost layer are placed and arranged according to a schematic circuit logic diagram, and as the cells of the circuit and the JTLs have a certain size, the arrangement of the cells of the circuit and the JTLs needs to follow an on grid principle.

(3) Clock lines of each of the cells are connected by using a JTL and a SPL of the logic cell layer. Since it is unnecessary to consider crossing with data lines, priority may be given to clock line routing that requires careful timing adjustment.

(4) After the clock line routing is completed, a JTL cell on the upper layer is used for data connection for each cell. A JTL of the transverse JTL routing layer is used for transverse data transmission, and a JTL of the longitudinal JTL routing layer is used for longitudinal data transmission. At the moment, an interface for the cells of the upper and lower layers achieves data connection by using the via.

(5) After the placement and routing of the circuit is completed, the connectivity between the circuit data and the bias line is checked, then simulation is performed, after a correct simulation result is obtained, processes of plate making, tape-out and package testing may be performed, and the subsequent process is the same as that of the design of the general superconducting circuit, which will not be repeated herein any more.

It is not difficult to conclude that the present disclosure uses a multi-layer junction technology, the JTL used for signal transmission is designed by using the junctions on the upper layer and the logic circuit portion is designed by using the junctions on the lower layer, thereby overcoming the shortcoming that the JTL is inconducive to routing, maintaining the advantage of the high speed of the circuit, improving the yield of the circuit, and laying a foundation for possible automatic placement and routing in the future.

What is claimed is:

1. A superconducting integrated circuit design method based on placement and routing by different-layer Josephson transmission lines (JTLs), comprising the following steps:
    step 1: cutting a bias line at a cell data interface of a cell library, and reserving a position of a via;
    step 2: placing and arranging cells on a logic cell layer according to a schematic circuit logic diagram;
    step 3: connecting clock lines of each of the cells by using a JTL and a splitter of the logic cell layer; and
    step 4: performing data connection on each of the cells by using JTLs of a transverse JTL routing layer and a longitudinal JTL routing layer which are not at the same layer as the logic cell layer,
    wherein the JTL of the transverse JTL routing layer is used as a transverse routing cell for data between the cells, the JTL of the longitudinal JTL routing layer is used as a longitudinal routing cell for data between the cells, and a JTL at an upper layer is connected to the cell data interface at a lower layer by using the via.

2. The superconducting integrated circuit design method based on placement and routing by different-layer JTLs according to claim 1, wherein
    a width of the via reserved in the step 1 is less than or equal to a width of the bias line.

3. The superconducting integrated circuit design method based on placement and routing by different-layer JTLs according to claim 1, wherein
    in the step 2, placing and arranging the cells on the logic cell layer follows an on grid principle.

4. The superconducting integrated circuit design method based on placement and routing by different-layer JTLs according to claim 1, wherein
    the logic cell layer comprises a ground layer, a top wire layer and a bottom electrode wire layer arranged from top to bottom,
    the bottom electrode wire layer is connected to a resistor, the top wire layer is connected to a standard Josephson triple-layer film junction, the bottom electrode wire layer acts as signal wiring, and the top wire layer acts as the bias line.

5. The superconducting integrated circuit design method based on placement and routing by different-layer JTLs according to claim 1, wherein
    the transverse JTL routing layer and the longitudinal JTL routing layer in the step 4 are different-layer structures.

6. The superconducting integrated circuit design method based on placement and routing by different-layer JTLs according to claim 1, wherein
    the transverse JTL routing layer comprises a ground layer, a top wire layer and a bottom electrode wire layer arranged from top to bottom,
    the top wire layer is connected to a self-shunted Josephson junction, the bottom electrode wire layer acts as signal wiring, and the top wire layer acts as the bias line.

7. The superconducting integrated circuit design method based on placement and routing by different-layer JTLs according to claim 1, wherein
    the longitudinal JTL routing layer comprises a ground layer, a top wire layer and a bottom electrode wire layer arranged from top to bottom,
    the top wire layer is connected to a self-shunted Josephson junction, the bottom electrode wire layer acts as signal wiring, and the top wire layer acts as the bias line.

* * * * *